(12) United States Patent
Noguchi et al.

(10) Patent No.: US 11,641,240 B2
(45) Date of Patent: May 2, 2023

(54) OPTICAL MODULE (71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 142 days.

(21) Appl. No.: 17/212,295

(22) Filed: Mar. 25, 2021

(65) Prior Publication Data
US 2021/0336701 A1 Oct. 28, 2021

(30) Foreign Application Priority Data

Apr. 24, 2020 (JP) .............................. JP2020-077640

(51) Int. Cl.
| | |
|---|---|
| *H04B 10/50* | (2013.01) |
| *H05K 1/11* | (2006.01) |
| *H01L 33/48* | (2010.01) |
| *H05K 1/18* | (2006.01) |
| *H01L 23/00* | (2006.01) |

(52) U.S. Cl.
CPC ........... *H04B 10/501* (2013.01); *H01L 24/05* (2013.01); *H01L 24/48* (2013.01); *H01L 33/483* (2013.01); *H05K 1/113* (2013.01); *H05K 1/181* (2013.01); *H01L 2224/48091* (2013.01); *H01L 2924/3011* (2013.01); *H01L 2924/30105* (2013.01)

(58) Field of Classification Search
CPC ..................................................... H04B 10/501
See application file for complete search history.

(56) References Cited

U.S. PATENT DOCUMENTS

| | | | |
|---|---|---|---|
| 8,005,327 B2 | 8/2011 | Saito et al. | |
| 2003/0091081 A1* | 5/2003 | Sahara ................. | H01S 5/1228 372/96 |
| 2003/0103709 A1* | 6/2003 | Grinberg ................. | G02F 1/065 385/2 |
| 2015/0261013 A1* | 9/2015 | Dobson .................. | G02C 5/143 351/158 |
| 2018/0351325 A1* | 12/2018 | Tanaka ..................... | H01S 5/042 |

FOREIGN PATENT DOCUMENTS

| | | | | |
|---|---|---|---|---|
| CN | 103780218 | * | 9/2017 | ............... H03H 9/15 |
| JP | 2009152472 A | | 7/2009 | |
| JP | 2009238965 A | | 10/2009 | |

* cited by examiner

*Primary Examiner* — Nathan M Cors
(74) *Attorney, Agent, or Firm* — Mattingly & Malur, PC (57) ABSTRACT

An optical module includes: a light source; an optical modulator capable of modulating light from the light source; a capacitor with an upper electrode and a lower electrode; and a resistor connected in series with and bonded face-to-face to the upper electrode of the capacitor. The resistor and the capacitor are connected in parallel with the optical modulator.

12 Claims, 13 Drawing Sheets

OPTICAL MODULE

CROSS-REFERENCE TO RELATED APPLICATION

The present application claims priority from Japanese patent application JP2020-77640 filed on Apr. 24, 2020, the contents of which are hereby incorporated by reference into this application.

BACKGROUND

1. Field

The disclosure relates to an optical module.

2. Description of the Related Art

An optical module with an optical modulator capable of modulating light in accordance with electric signals is known (JP 2009-152472A, JP 2009-238965A). A terminating resistor is connected in parallel with the optical modulator to match the impedance.

Connecting a capacitor in series with the terminating resistor, to impede flow of a direct current component, enables reduction of power consumption. However, this requires a region to mount the capacitor, leading to a larger size of the package. Additionally, connecting the terminating resistor and the capacitor with a wire requires a bonding region for the wire, impairing high-frequency characteristics due to higher impedance. Note that JP 2009-152472A discloses no capacitor connected in series with the terminating resistor. The structure of JP 2009-238965A, where the terminating resistor and the capacitor are on the same plane, cannot avoid increase in size of the package.

SUMMARY

The disclosure aims at avoiding increase in size and in impedance.

(1) An optical module includes: a light source; an optical modulator capable of modulating light from the light source; a capacitor with an upper electrode and a lower electrode; and a resistor connected in series with and bonded face-to-face to the upper electrode of the capacitor. The resistor and the capacitor are connected in parallel with the optical modulator.

The capacitor and the resistor are bonded face-to-face, therefor avoiding increase in impedance due to use of the wire; the resistor is on the capacitor, therefor avoiding increase in size.

(2) In the optical module according to (1), the light source and the optical modulator may be an integrated optical semiconductor device.

(3) In the optical module according to (1) or (2), the resistor may include a first conductor bonded face-to-face to the upper electrode of the capacitor, a second conductor, and a resistive element electrically connected in series between the first conductor and the second conductor.

(4) In the optical module according to (3), the resistor further may include an insulator. The first conductor may extend on the insulator from a lower surface to an upper surface. The second conductor and the resistive element may be on the upper surface of the insulator.

(5) In the optical module according to (4), the first conductor may extend on a side surface of the insulator.

(6) In the optical module according to (4), the first conductor may be configured to penetrate the insulator.

(7) In the optical module according to any one of (4) to (6), the insulator and the second conductor may have respective end portions at positions overhanging from the capacitor in a direction approaching the optical modulator.

(8) The optical module according to any one of (4) to (7) may further include a wire having one end bonded to an end portion of the second conductor of the resistor, the wire having another end bonded to the optical modulator.

(9) The optical module according to any one of (4) to (7) may further include: a bonding pad next to the optical modulator in an opposite direction to the capacitor; a first wire having one end bonded to the optical modulator, the first wire having another end bonded to the bonding pad; and a second wire having one end bonded to an end portion of the second conductor of the resistor, the second wire arranged above the optical modulator, the second wire having another end bonded to the bonding pad.

(10) The optical module according to any one of (1) to (9) may further include: a conductive block having a first surface and a second surface, the conductive block having some through holes configured to penetrate between the first surface and the second surface, the conductive block having a pedestal portion on the first surface; and some lead pins fixed inside the through holes and insulated from the conductive block. The capacitor may be mounted on the pedestal portion.

(11) The optical module according to (10) may further include a mounting substrate on which the light source and the optical modulator are mounted, the mounting substrate being mounted on the pedestal portion.

(12) In the optical module according to any one of (1) to (11), the light source may include some light sources. The optical modulator may include some optical modulators corresponding to the respective light sources. The capacitor may include some capacitors. The resistor may include some resistors corresponding to the respective capacitors. The optical modulators and the capacitors may be alternately arranged.

(13) In the optical module according to (11), the pedestal portion may include a first region and a second region lower than the first region, on an upper surface. The mounting substrate may be mounted on the first region, and the capacitor may be mounted on the second region.

(14) In the optical module according to (11), the pedestal portion may include a first region and a second region lower than the first region, on an upper surface. The mounting substrate may be mounted on the first region. The light source may include some light sources. The optical modulator may include some optical modulators corresponding to the respective light sources. The capacitor may include some capacitors consisting of at least one first capacitor mounted on the first region and at least one second capacitor mounted on the second region. The resistor may include some resistors corresponding to the respective capacitors.

DETAILED DESCRIPTION

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

Figure 1:
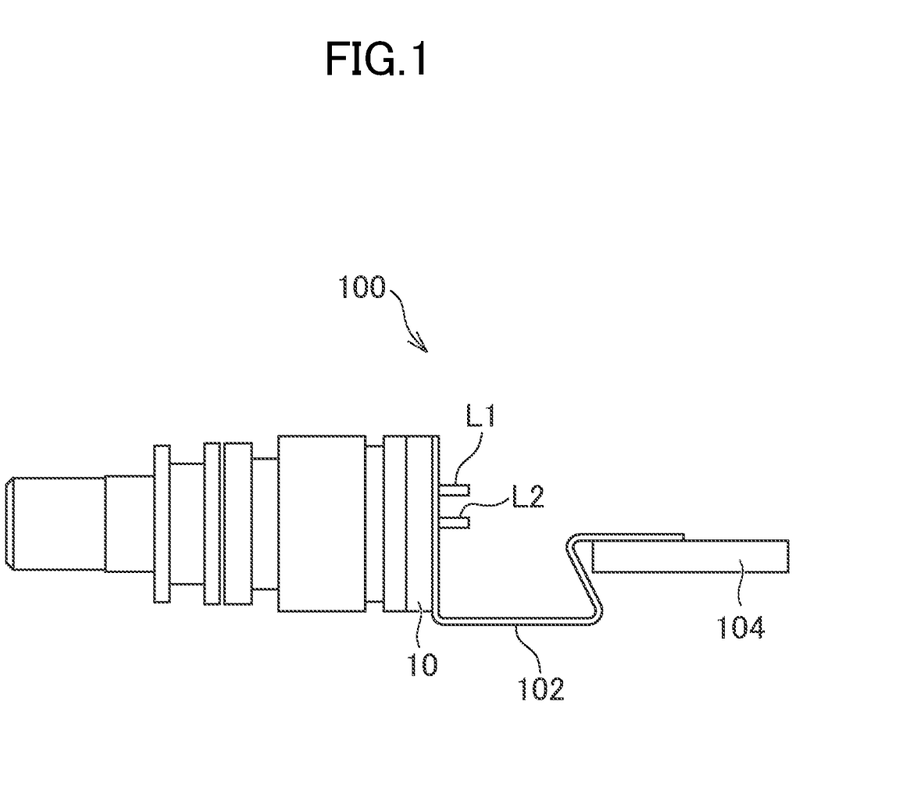
FIG. 1 is a side view of an optical module in a first embodiment.

FIG. 1 is a side view of an optical module in a first embodiment. An optical module 100 is a TO-CAN (Transistor Outline-Can) type optical module and may be either of TOSA (Transmitter Optical Sub-Assembly) with a light emitting element and BOSA (Bidirectional Optical Sub-Assembly) with both a light emitting element and a light receiving element. The optical module 100 has a flexible substrate (FPC) 102, which is connected to a printed circuit board (PCB) 104. The optical module 100 has a conductive block 10 (e.g., eyelet).

Figure 2:
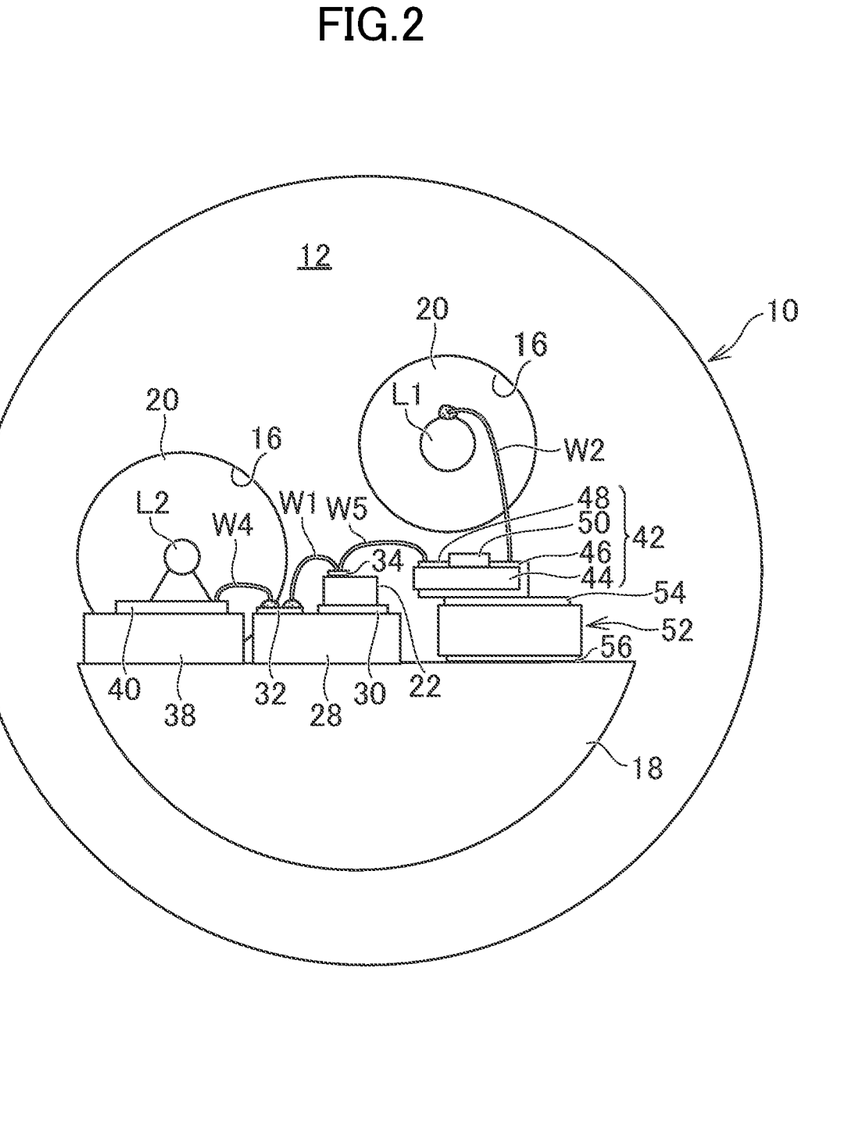
FIG. 2 is a front view of a conductive block and electronic components mounted thereon.
Figure 3:
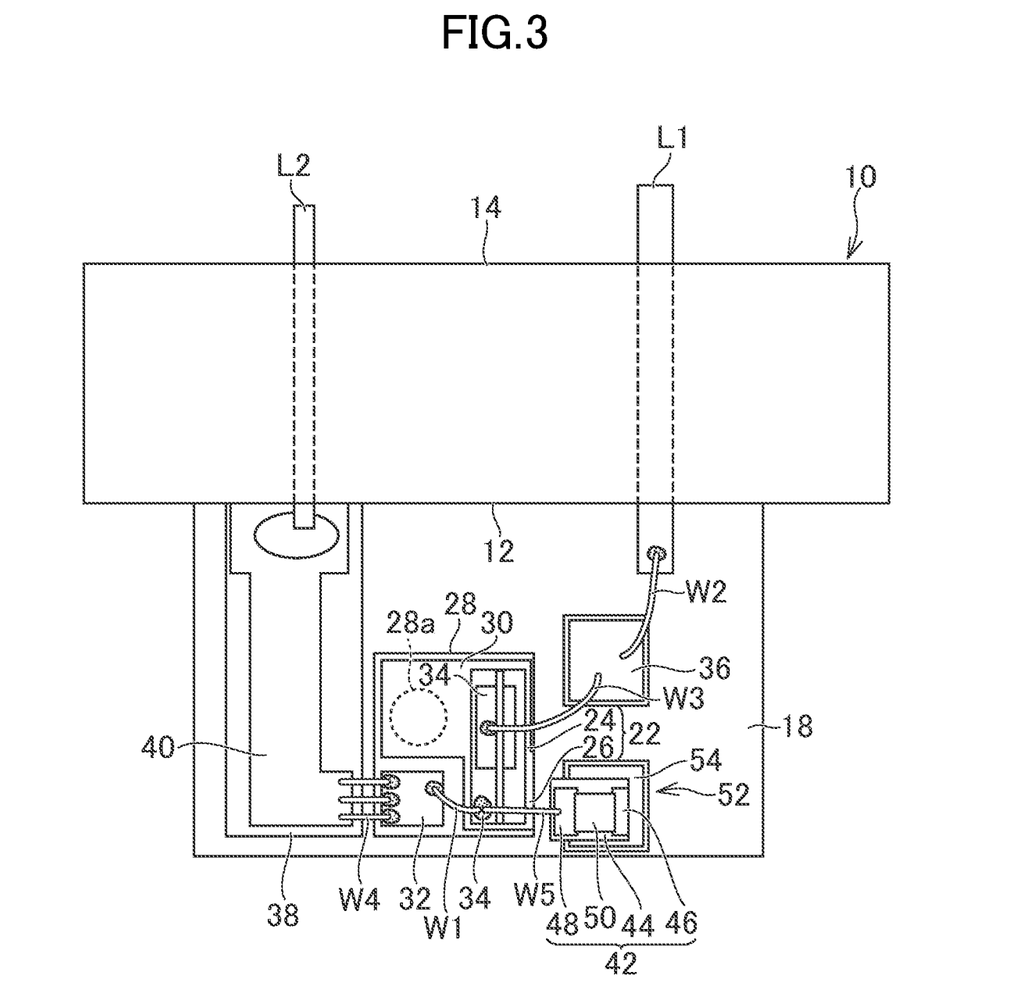
FIG. 3 is a plan view of the conductive block and the electronic components mounted thereon in FIG. 2.

FIG. 2 is a front view of the conductive block 10 and electronic components mounted thereon. FIG. 3 is a plan view of the conductive block 10 and the electronic components mounted thereon in FIG. 2.

The conductive block 10 is made of conductive material such as metal, and has a first surface 12 and a second surface 14. The conductive block 10 has some through holes configured to penetrate between the first surface 12 and the second surface 14. The conductive block 10 has a pedestal portion 18 integral to the first surface 12. The pedestal portion 18 is raised on the first surface 12 and has an upper surface facing a direction parallel to the first surface 12. The pedestal portion 18 is also made of the conductive material. The conductive block 10 is connected to a reference potential, e.g., ground.

The optical module 100 has some lead pins L1, L2. The lead pins L1, L2 are fixed inside the respective through-holes 16 and insulated from the conductive block 10. For example, the through holes 16 are filled with insulating material 20 such as glass. The lead pins L1, L2 protrude from the first surface 12. The lead pins L1, L2 also protrude from the second surface 14 and are connected to the flexible substrate 102 (FIG. 1).

The optical module 100 has an optical semiconductor device 22. The optical semiconductor device 22 is a modulator-integrated semiconductor optical device (e.g., modulator integrated laser) where a light source 24 (e.g., laser) and an optical modulator 26 are monolithically integrated. The light source 24 and the optical modulator are integrated. The light source 24 is configured to emit continuous light by driving current injected therein. The optical modulator 26 is configured to modulate light from the light source 24. Thus, signal light is output. The optical modulator 26 is configured to be driven single-ended.

The optical semiconductor device 22 (light source 24, optical modulator 26) is mounted on a mounting substrate 28 made of insulating material. The mounting substrate 28 is fixed to the pedestal portion 18 (its upper surface). The mounting substrate 28 has an electrode pad 30 formed thereon in an opposite direction to the pedestal portion 18. The electrode pad 30 is electrically connected to the pedestal portion 18 of the reference potential (e.g., ground), through a via hole 28a and an unillustrated castellation.

The optical semiconductor device 22, in the light source 24 and the optical modulator 26 as well, is bonded to the electrode pad 30 at the lower surface, thereby stabilizing the ground potential. The optical semiconductor device 22 has a bonding electrode 34 of each of the light source 24 and the optical modulator 26, on the upper surface.

The mounting substrate 28 has a bonding pad 32 formed thereon next to the electrode pad 30. The bonding pad 32 is not electrically connected to the pedestal portion 18. A wire W1 has one end bonded to the bonding pad 32 and has another end bonded to the bonding electrode 34 of the optical modulator 26.

A bypass capacitor 36 is mounted on the pedestal portion 18. The bypass capacitor 36 at the rear surface is electrically connected to the pedestal portion 18 and is connected to the reference potential (e.g., ground). A wire W2 has one end bonded to the lead L1 for DC power supply and has another end bonded to the upper surface of the bypass capacitor 36. Another wire W3 has one end bonded to the upper surface of the bypass capacitor 36 and has another end bonded to the bonding electrode 34 of the light source 24. The bypass capacitor 36 is connected in parallel with the light source 24 that is connected to the direct power supply, thereby letting high frequency noises, overlapping with the direct current bias, escape to the reference potential (e.g., ground).

A relay substrate 38, made of insulating material, is mounted on the pedestal portion 18. The relay board 38 has an interconnection pattern 40 formed thereon in an opposite direction to the pedestal portion 18. The interconnection pattern 40 is bonded to the lead L2 for transmitting modulated electrical signals, possibly with gold tin solder. The interconnection pattern 40 of the relay substrate 38 enables impedance matching up to high frequencies, because of being lower in inductance than lead pins or wires. A wire W4 has one end bonded to the interconnection pattern 40 and has another end bonded to the bonding pad 32 of the mounting substrate 28. To shorten the wire W4 as much as possible, the interconnection pattern 40 and the bonding pad 32 should be close.

The optical module 100 has a resistor 42. The resistor 42 has an insulator 44 shown in FIG. 2 (e.g., insulating substrate). The resistor 42 has a first conductor 46. The first conductor 46 extends on the insulator 44 from a lower surface to an upper surface. Specifically, the first conductor 46 is configured to run through a side surface of the insulator 44. The resistor 42 has a second conductor 48. The second conductor 48 is on the upper surface of the insulator 44. The second conductor 48 is at a position overlapping with the first conductor 46, enabling planar miniaturization of the resistor 42. The resistor 42 has a resistive element 50. The resistive element 50 is electrically connected in series between the first conductor 46 and the second conductor 48. The resistive element 50 is on the upper surface of insulator 44.

The optical module 100 has a capacitor 52. The capacitor 52 is mounted on the pedestal portion 18 of the conductive block 10. The capacitor 52 has an upper electrode 54 and a lower electrode 56. The lower electrode 56 is electrically connected to the pedestal portion 18.

The resistor 42 is bonded face-to-face to the capacitor 52. Specifically, the first conductor 46 is bonded face-to-face to the upper electrode 54 of the capacitor 52. A conductive adhesive may be used for the face-to-face bonding. The face-to-face bonding can avoid increase in impedance caused by use of wires. Further, providing the resistor 42 on the capacitor 52 can avoid increase in planar size of the optical module 100.

The resistor 42 is connected in parallel with the optical modulator 26 that is a high resistor, enabling termination with a resistance equal to the characteristic impedance (e.g., 50Ω) of the line. The capacitor 52 is connected in series with the resistor 42; the resistor 42 and the capacitor 52 are connected in parallel with optical modulator 26. The capacitor 52 is configured to pass a high-frequency current; the resistor 42 is the terminal in the high-frequency region. On the other hand, the capacitor 52 passes no direct current, reducing heat generation in the resistor 42, enabling low power consumption of an unillustrated temperature regulator (e.g., Peltier element).

The insulator 44 has an end portion at a position overhanging from the capacitor 52 in a direction approaching the optical modulator 26. The second conductor 48 has an end portion at a position overhanging from the capacitor 52 in the direction approaching the optical modulator 26. A wire W5 has one end bonded to the end portion of the second conductor 48 of the resistor 42. The wire W5 has another end bonded to the optical modulator 26 (bonding electrode 34).

With a sufficient gap between the capacitor 52 and the mounting substrate 28, interference between the resistor 42 and the mounting substrate 28 can be avoided. Additionally, with a minimized area of the second conductor 48, there is no problem of inter-ground resonance with the pedestal portion 18, stabilizing the ground potential.

The capacitor 52 has its parasitic inductance reduced in accordance with the capacitance value, works as an ideal capacitor 52 in a high frequency band, and should be a capacitor of about 0.1 μF. Suppose a flat capacitor of 0.5 mm square is used for the capacitor 52 of 0.1 pF, the insulator 44 of the resistor 42 may be as small as 0.35 mm square.

Thus, placing resistor 42 on the capacitor 52 is the least wasted layout in space. Conversely, if the capacitor 52 is bonded onto the resistor 42, there is a concern that the conductive adhesive used for bonding may wet and spread over the resistive element 50. This requires measures such as limiting the wet spreading, and the insulator 44 also needs to have a size of 0.5 mm square or more, leading to a great disadvantage in terms of cost.

Figure 4:
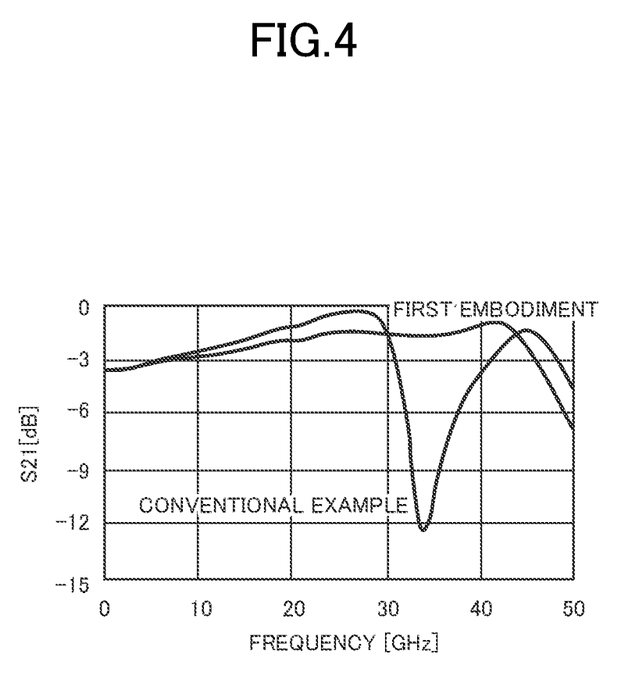
FIG. 4 is a diagram of frequency characteristics, in a conventional example and the first embodiment, obtained by simulation using a three-dimensional electric field analysis tool.

FIG. 4 is a diagram of frequency characteristics, in a conventional example and the first embodiment, obtained by simulation using a three-dimensional electric field analysis tool. The conventional example is supposed to have a resistor and a capacitor arranged without overlapping with each other, making a ground pattern wider, limiting the practical band to about 30 GHz because of ground resonance. On the other hand, in the first embodiment, a sufficient transmission characteristic (S21) up to a frequency exceeding 40 GHz is obtained.

Second Embodiment

Figure 5:
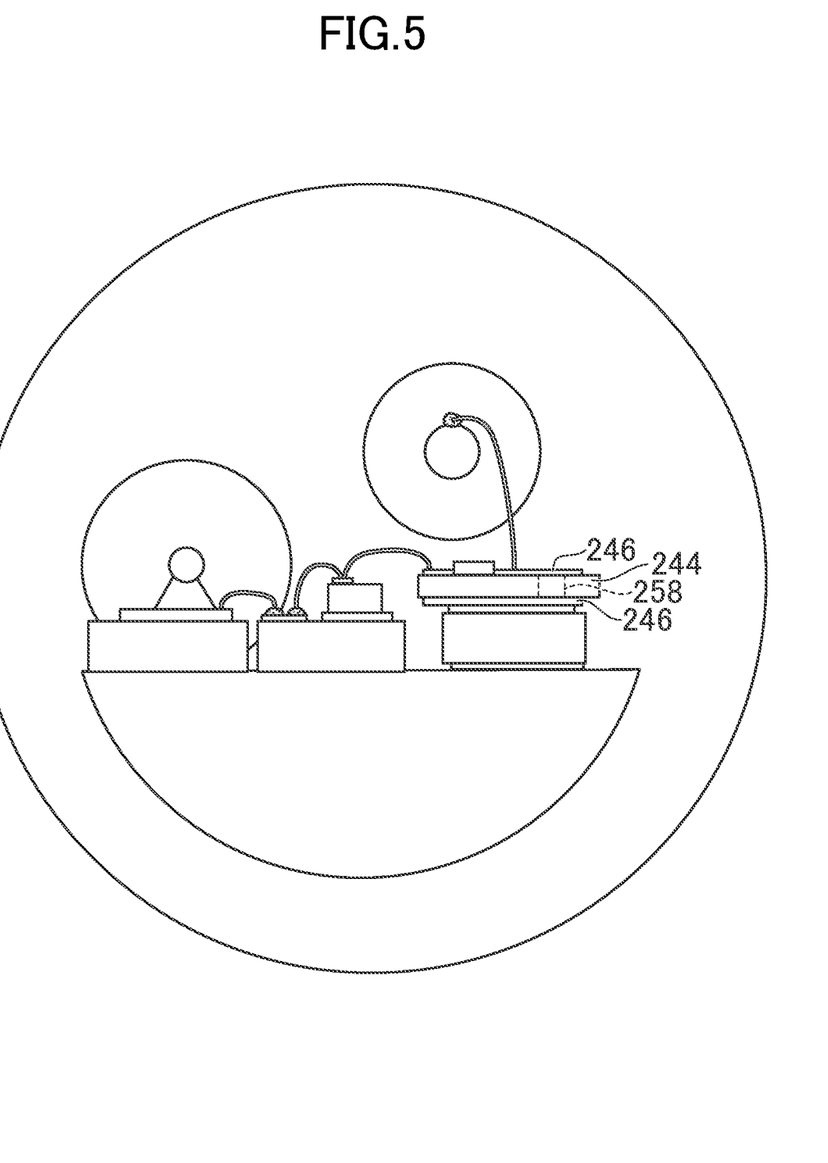
FIG. 5 is a front view of a conductive block and electronic components mounted thereon in a second embodiment.
Figure 6:
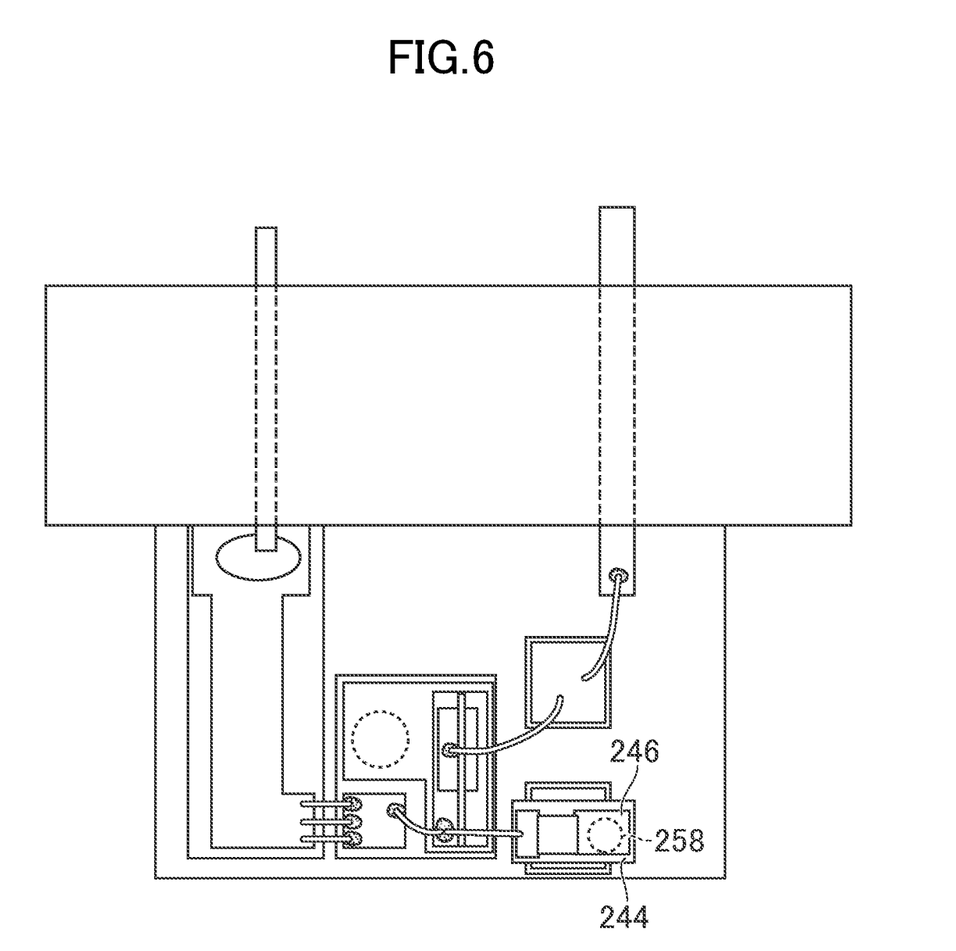
FIG. 6 is a plan view of the conductive block and the electronic components mounted in FIG. 5.

FIG. 5 is a front view of a conductive block and electronic components mounted thereon in a second embodiment. FIG. 6 is a plan view of the conductive block and the electronic components mounted thereon in FIG. 5.

The first conductor 246 is configured to penetrate the insulator 244. The first conductor 246 has separate portions on the lower surface and the upper surface of the insulator 244, and both are electrically connected by a via hole 258, for example. What is explained in the first embodiment is applicable to other structures.

Third Embodiment

Figure 7:
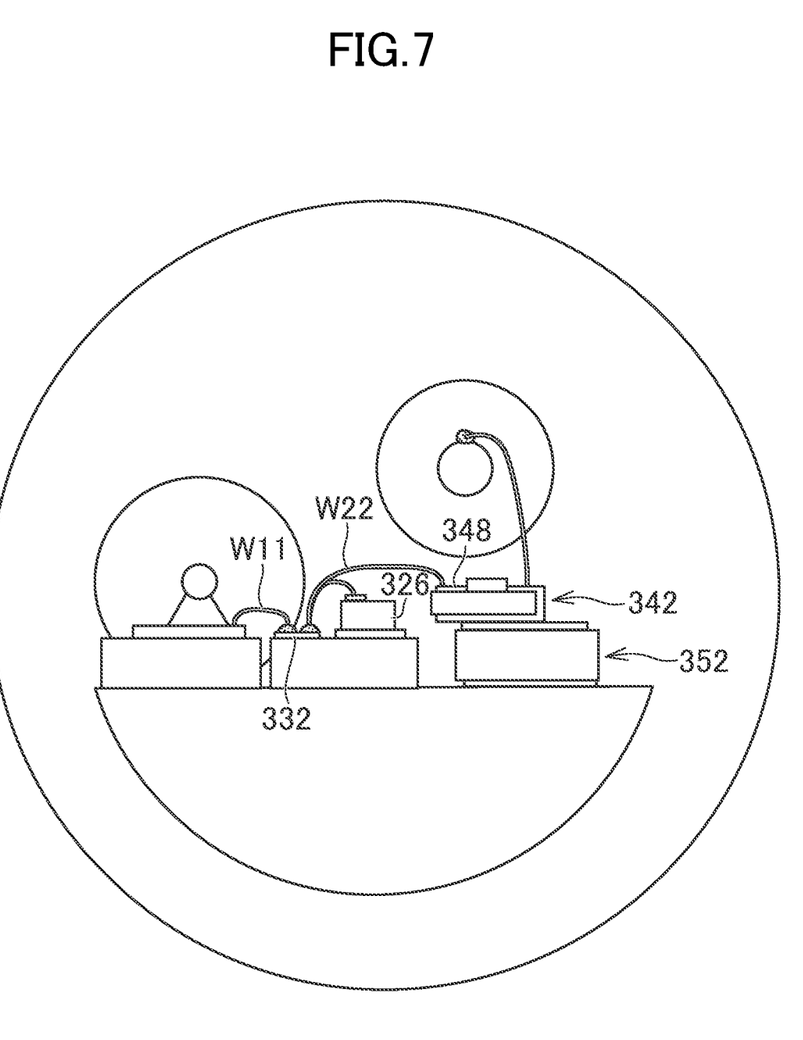
FIG. 7 is a front view of a conductive block and electronic components mounted thereon in a third embodiment.
Figure 8:
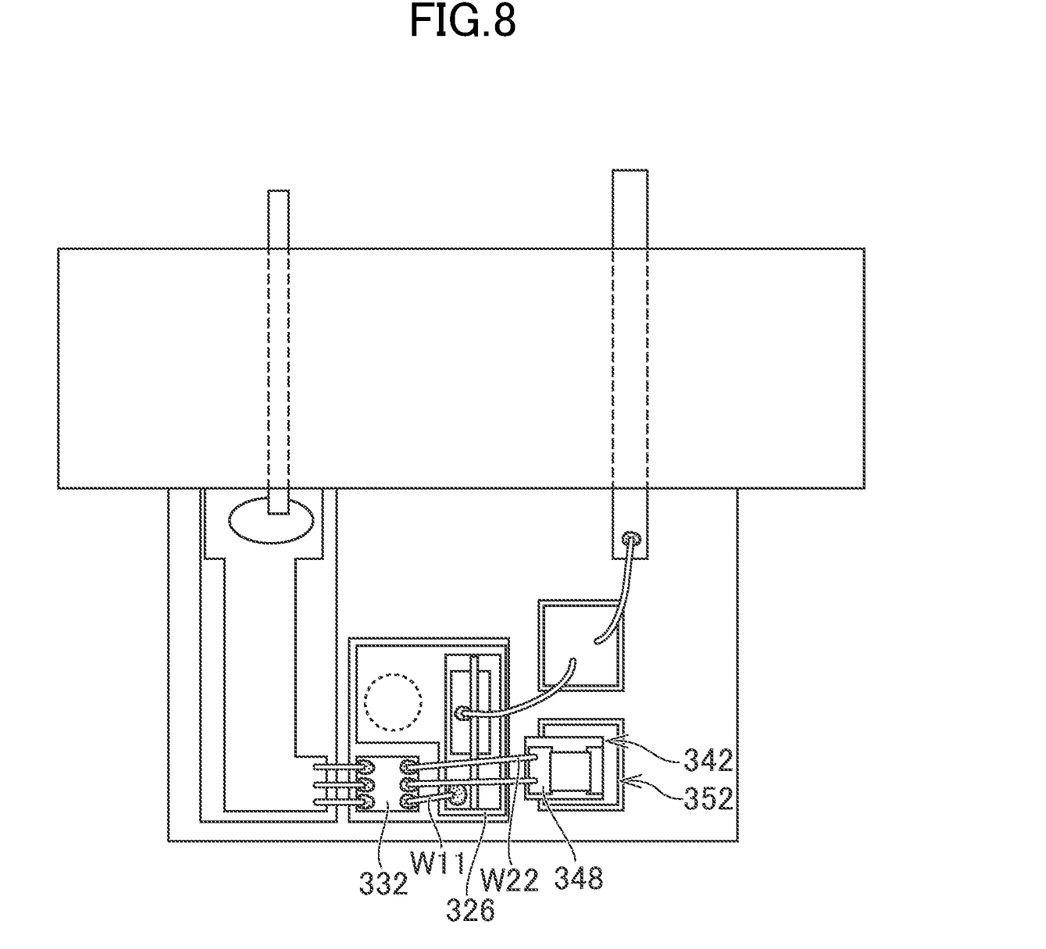
FIG. 8 is a plan view of the conductive block and the electronic components mounted thereon in FIG. 7.

FIG. 7 is a front view of a conductive block and electronic components mounted thereon in a third embodiment. FIG. 8 is a plan view of the conductive block and the electronic components mounted thereon in FIG. 7.

The optical module has a bonding pad 332. The bonding pad 332 is next to optical modulator 326 in an opposite direction to the capacitor 352. The first wire W11 has one end bonded to the optical modulator 326 and has another end bonded to the bonding pad 332. The second wire W22 has one end bonded to the end portion of the second conductor 348 of the resistor 342 and has another end bonded to the bonding pad 332. The second wire W22 is arranged above the optical modulator 326.

In the embodiment, there is no wire directly connecting the optical modulator 326 and the resistor 342 and both are electrically connected by first wires W11 and second wires W22. Using the multiple first wires W11 and the multiple second wires W22 can further reduce the inductance. What is explained in the first embodiment is applicable to other structures.

Fourth Embodiment

Figure 9:
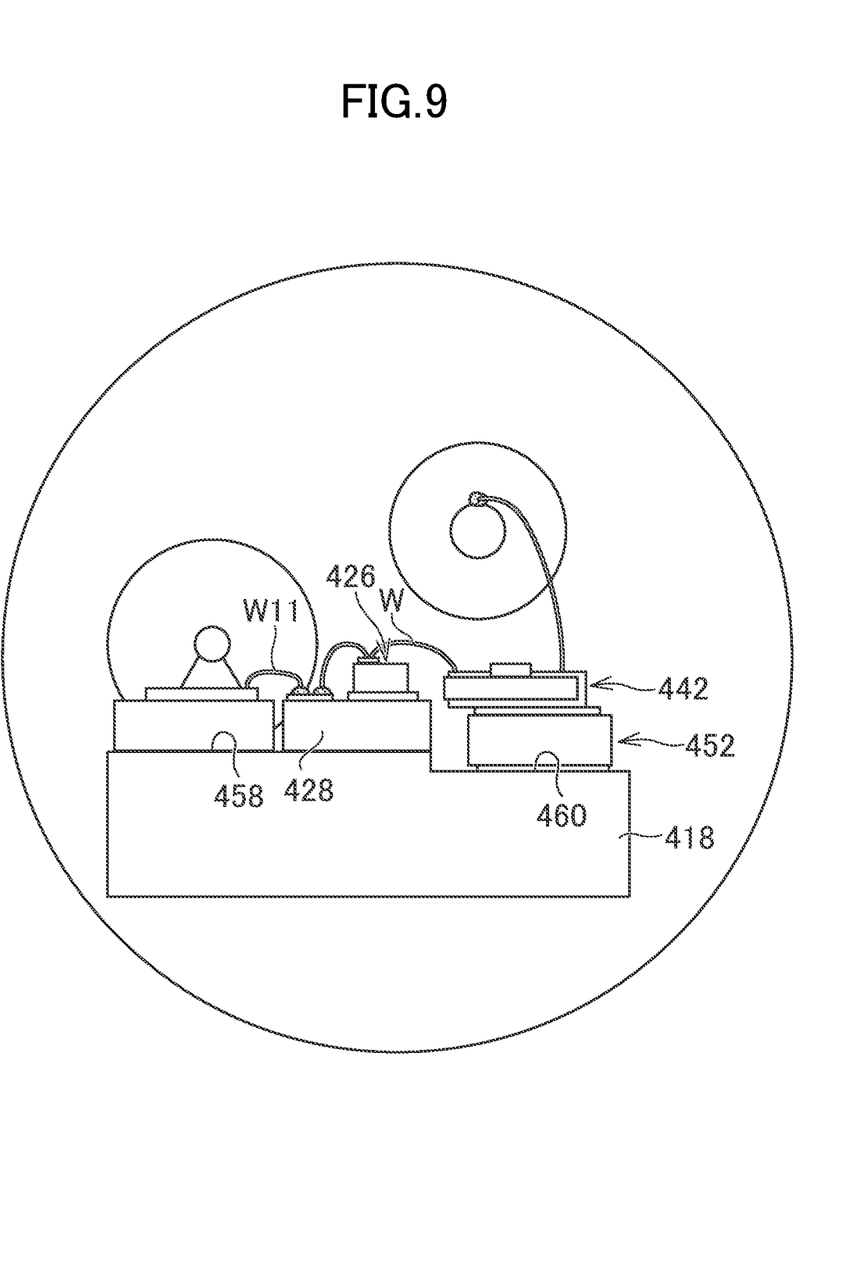
FIG. 9 is a front view of a conductive block and electronic components mounted thereon in a fourth embodiment.
Figure 10:
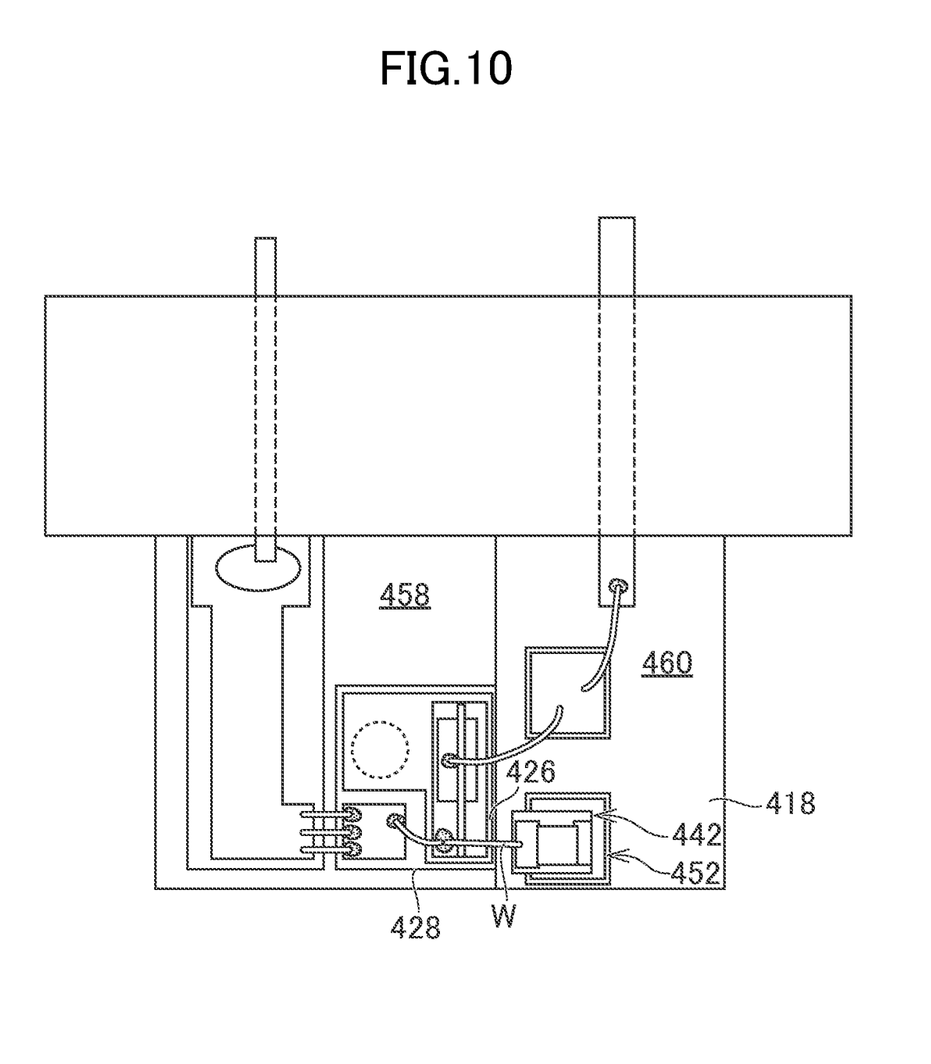
FIG. 10 is a plan view of the conductive block and the electronic components mounted thereon in FIG. 9.

FIG. 9 is a front view of a conductive block and electronic components mounted thereon in a fourth embodiment. FIG. 10 is a plan view of the conductive block and the electronic components mounted thereon in FIG. 9.

The pedestal portion 418 includes a first region 458 on an upper surface thereof. The pedestal portion 418 includes a second region 460, lower than the first region 458, on the upper surface. The mounting substrate 428 is mounted on the first region 458. The capacitor 452 is mounted on the second region 460. The second region 460 is lowered, whereby the resistor 442 mounted on the capacitor 452 is disposed lower. Thus, the difference in height of one end (bonding portion to the resistor 442) and another end (bonding portion to the optical modulator 426), of the wire W, becomes smaller, shortening the wire W and reducing the inductance. This further reduces the impedance in the high frequency region, enabling impedance matching up to the high frequency region. What is explained in the first embodiment is applicable to other structures.

Fifth Embodiment

Figure 11:
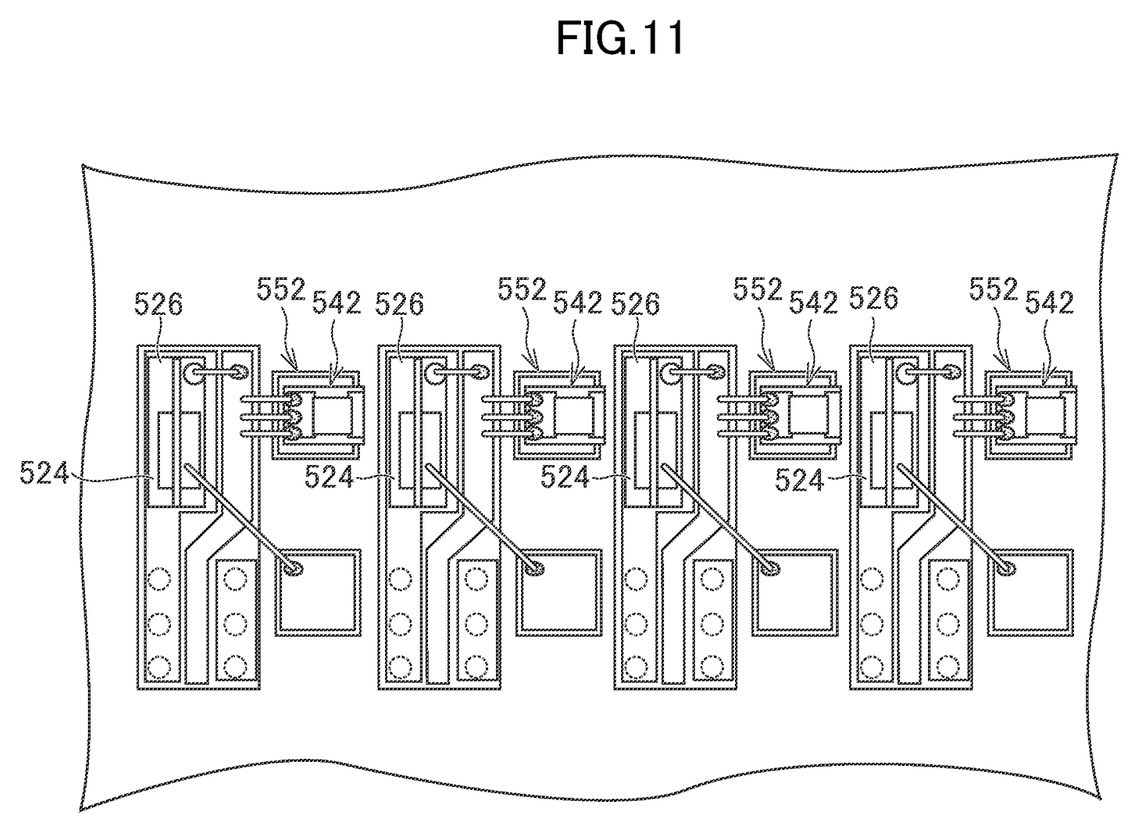
FIG. 11 is a plan view of a conductive block and electronic components mounted thereon in a fifth embodiment.

FIG. 11 is a plan view of a conductive block and electronic components mounted thereon in a fifth embodiment.

The modulators 526 correspond to the respective light sources 524. The resistors 542 correspond to the respective capacitors 552. The optical modulators 526 and the capacitors 552 are alternately arranged. What is explained in the first embodiment is applicable to other structures.

Sixth Embodiment

Figure 12:
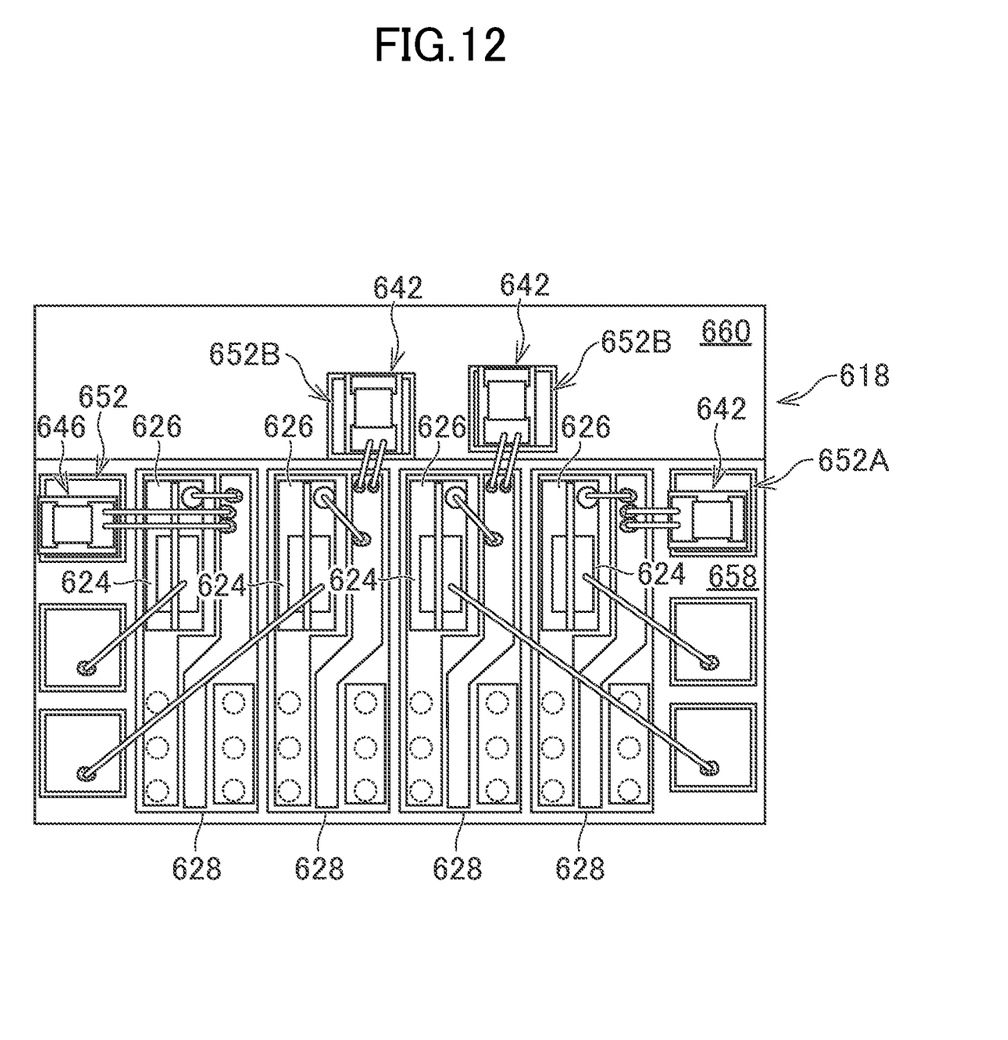
FIG. 12 is a plan view of a pedestal portion and electronic components mounted thereon in a sixth embodiment.
Figure 13:
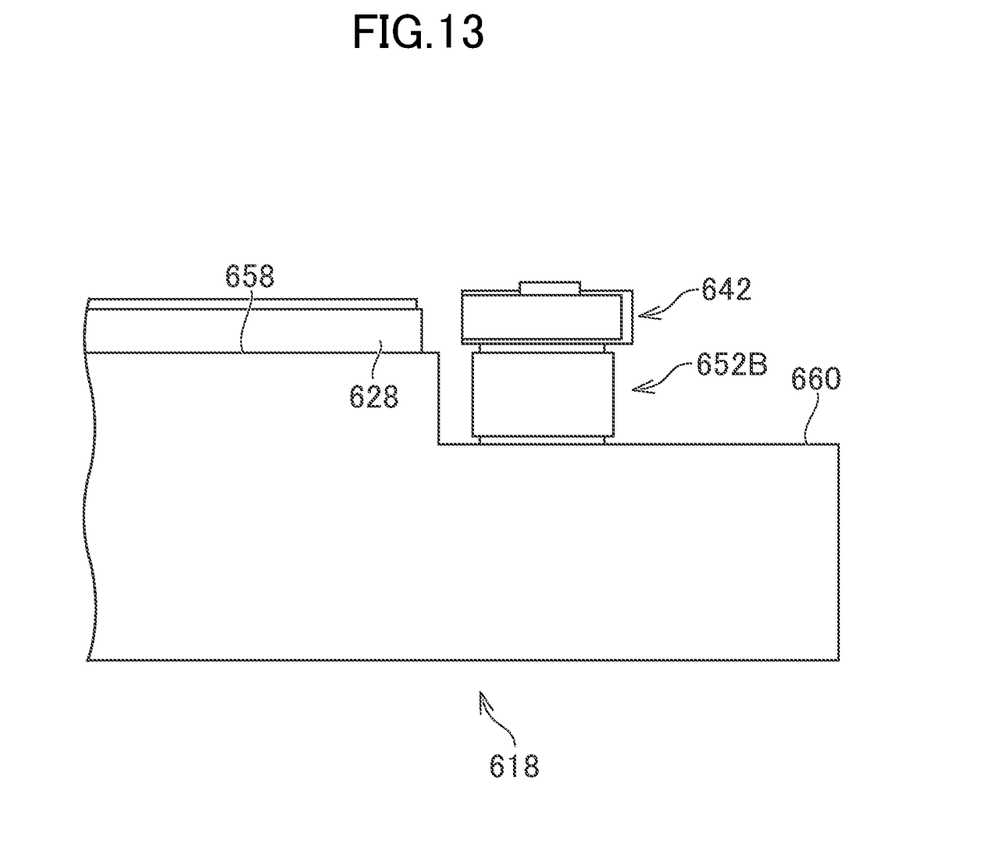
FIG. 13 is a partial side view of the pedestal portion and the electronic components mounted thereon in FIG. 12.

FIG. 12 is a plan view of a pedestal portion and electronic components mounted thereon in a sixth embodiment. FIG. 13 is a partial side view of the pedestal portion and the electronic components mounted thereon in FIG. 12.

The pedestal portion 618 includes a first region 658 on the upper surface. The pedestal portion 618 includes a second region 660, lower than the first region 658, on the upper surface. The mounting substrate 628 is mounted on the first region 658. The optical modulators 626 correspond to the respective light sources 624.

At least one first capacitor 652A is mounted on the first region 658; at least one second capacitor 652B is mounted on the second region 660. The resistors 642 correspond to the respective capacitors (first capacitor 652A, second capacitor 652B). What is explained in the first embodiment is applicable to other structures.

The embodiments described above are not limited and various variations are possible. The structures explained in the embodiment may be replaced with substantially the same structures and other structures that can achieve the same effect or the same objective.

What is claimed is:

1. An optical module comprising:
a light source;
an optical modulator capable of modulating light from the light source;
a capacitor with an upper electrode and a lower electrode; and
a resistor connected in series with and bonded face-to-face to the upper electrode of the capacitor,
wherein the resistor and the capacitor are connected in parallel with the optical modulator,
wherein the resistor includes a first conductor bonded face-to-face to the upper electrode of the capacitor, a second conductor, and a resistive element electrically connected in series between the first conductor and the second conductor,
wherein
the resistor further includes an insulator,
the first conductor extends on the insulator from a lower surface to an upper surface, and
the second conductor and the resistive element are on the upper surface of the insulator.

2. The optical module according to claim 1, wherein the first conductor extends on a side surface of the insulator.

3. The optical module according to claim 1, wherein the first conductor is configured to penetrate the insulator.

4. The optical module according to claim 1, wherein the insulator and the second conductor have respective end portions at positions overhanging from the capacitor in a direction approaching the optical modulator.

5. The optical module according to claim 1, further comprising a wire having one end bonded to an end portion of the second conductor of the resistor, the wire having another end bonded to the optical modulator.

6. The optical module according to claim 1, further comprising:
a bonding pad next to the optical modulator in an opposite direction to the capacitor;
a first wire having one end bonded to the optical modulator, the first wire having another end bonded to the bonding pad; and
a second wire having one end bonded to an end portion of the second conductor of the resistor, the second wire arranged above the optical modulator, the second wire having another end bonded to the bonding pad.

7. The optical module according to claim 1, wherein
the light source includes some light sources,
the optical modulator includes some optical modulators corresponding to the respective light sources,
the capacitor includes some capacitors,
the resistor includes some resistors corresponding to the respective capacitors, and
the optical modulators and the capacitors are alternately arranged.

8. The optical module according to claim 1, wherein the light source and the optical modulator are an integrated optical semiconductor device.

9. An optical module comprising:
a light source;
an optical modulator capable of modulating light from the light source;
a capacitor with an upper electrode and a lower electrode;
a resistor connected in series with and bonded face-to-face to the upper electrode of the capacitor;
a conductive block having a first surface and a second surface, the conductive block having some through holes configured to penetrate between the first surface and the second surface, the conductive block having a pedestal portion on the first surface; and
lead pins fixed inside the through holes and insulated from the conductive block,
wherein the resistor and the capacitor are connected in parallel with the optical modulator, and
wherein the capacitor is mounted on the pedestal portion.

10. The optical module according to claim 9, further comprising a mounting substrate on which the light source and the optical modulator are mounted, the mounting substrate being mounted on the pedestal portion.

11. The optical module of claim 10, wherein
the pedestal portion includes a first region and a second region lower than the first region, on an upper surface,
the mounting substrate is mounted on the first region, and
the capacitor is mounted on the second region.

12. The optical module of claim 10, wherein
the pedestal portion includes a first region and a second region lower than the first region, on an upper surface,
the mounting substrate is mounted on the first region,
the light source includes some light sources,
the optical modulator includes some optical modulators corresponding to the respective light sources,
the capacitor includes some capacitors consisting of at least one first capacitor mounted on the first region and at least one second capacitor mounted on the second region, and
the resistor includes some resistors corresponding to the respective capacitors.

* * * * *